United States Patent
Wanat et al.

(10) Patent No.: US 6,911,293 B2
(45) Date of Patent: Jun. 28, 2005

(54) PHOTORESIST COMPOSITIONS COMPRISING ACETALS AND KETALS AS SOLVENTS

(75) Inventors: Stanley F. Wanat, Scotch Plains, NJ (US); Joseph E. Oberlander, Phillipsburg, NJ (US); Robert R. Plass, Hackensack, NJ (US); Douglas McKenzie, Easton, PA (US)

(73) Assignee: Clariant Finance (BVI) Limited, Tortola (VG)

(*) Notice: Subject to any disclaimer, the term of this patent is extended or adjusted under 35 U.S.C. 154(b) by 0 days.

(21) Appl. No.: 10/120,952

(22) Filed: Apr. 11, 2002

(65) Prior Publication Data

US 2003/0194636 A1 Oct. 16, 2003

(51) Int. Cl.$^7$ .............................. G03F 7/023; G03F 7/30
(52) U.S. Cl. ..................... 430/191; 430/192; 430/193; 430/270.1; 430/326; 430/905; 430/910
(58) Field of Search ................................ 430/165, 191, 430/192, 193, 270.1, 326, 905, 910

(56) References Cited

U.S. PATENT DOCUMENTS

| | | | |
|---|---|---|---|
| 5,204,216 A | | 4/1993 | Kim .......................... 430/270.1 |
| 6,060,217 A | * | 5/2000 | Nguyen et al. ............. 430/302 |
| 6,106,994 A | * | 8/2000 | Niikura et al. ........... 430/270.1 |
| 6,238,831 B1 | | 5/2001 | Hauck et al. ................. 430/49 |
| 6,517,988 B1 | * | 2/2003 | Hauck et al. ............... 430/165 |
| 6,613,494 B2 | * | 9/2003 | Savariar-Hauck et al. ...................... 430/272.1 |
| 6,645,689 B2 | * | 11/2003 | Jarek .......................... 430/168 |
| 6,706,454 B2 | * | 3/2004 | Jarek ........................... 430/18 |

FOREIGN PATENT DOCUMENTS

| | | |
|---|---|---|
| EP | 0 273 026 A2 | 6/1988 |
| EP | WO 03/005125 A1 | 1/2003 |

OTHER PUBLICATIONS

Notification of Transmittal of the International Preliminary Examination Report (Form PCT/IPEA/416).
International Preliminary Examination Report (Form PCT/IPEA/409.
Notification of Transmittal of the International Preliminary Examination Report (Form PCT/IPEA/416).

* cited by examiner

*Primary Examiner*—John S. Chu
(74) *Attorney, Agent, or Firm*—Alan P. Kass

(57) ABSTRACT

Disclosed is a photoresist composition comprising: a) at least one film forming resin selected from the group consisting of novolak resins, and polyhydroxystyrenes; b) at least one photoactive compound or photoacid generator; and c) a solvent composition comprising at least one solvent selected from the group consisting of acetals and ketals. Also disclosed is a photoresist composition comprising a polycarbonate resin and a solvent composition comprising at least one solvent selected from the group consisting of acetals and ketals. Also disclosed is a process for imaging a photoresist composition, comprising the steps of: a) coating a suitable substrate with any of the aforementioned photoresist compositions; b) baking the substrate to substantially remove the solvent; c) imagewise irradiating the photoresist film; and d) removing the imagewise exposed or, alternatively, the unexposed areas of the coated substrate with a suitable developer.

26 Claims, No Drawings

PHOTORESIST COMPOSITIONS COMPRISING ACETALS AND KETALS AS SOLVENTS

FIELD OF THE INVENTION

This invention relates to photoresist compositions and to a process for forming an image on a substrate utilizing said photoresist compositions.

BACKGROUND OF THE INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a deprotection reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature, which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

It is desirable and advantageous to have photoresist compositions that result excellent photospeed properties, depth of focus and sidewall profile geometries. Especially for thick film resists (e.g., >20 micrometers ($\mu$m)), fast photospeeds are desirable. The present invention provides such photoresist compositions.

U.S. Pat. Nos. 4,294,909 and 4,356,252, inventor Lee, issued Oct. 13, 1981, and Oct. 26, 1982 respectively, discloses a photosensitive element which comprises a support bearing a layer of negative-working tonable photoimaging composition comprising at least one organic polymeric binder (a), a photosensitizer (b) which generates an acid upon absorption of actinic radiation, and at least one compound taken from the group of

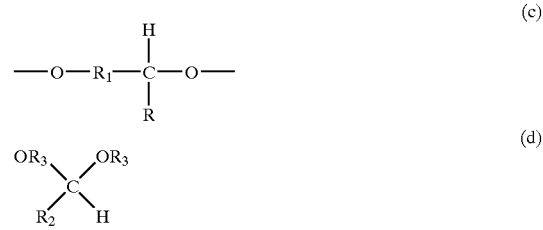

as defined in the patents, binder (a) being plasticized by the decomposition product of either compound (c) or (d) or the combination thereof. The photosensitive element is useful in making color proofs.

Japanese patent application JP9031044, inventor Atsushi, Sumitomo Chemical Co., discloses that to solve the problem of producing an azide-based photosensitizer capable of shortening the filtration time with a crystal having a large grain diameter at a high reactional rate by using 1,3-dioxolane without any problem in safety as a reactional solvent, a compound having phenolic hydroxyl group (e.g. 2,3,4,4'-tetrahydroxybenzophenone) is condensed with a 2-naphthoquinone diazide-4- or a 2-naphthoquinone diazide-5-sulfonyl halide (e.g. 1,2-naphthoquinone diazide-4- or 2-naphthoquinone diazide-5-sulfonyl chloride) in a solvent containing 1,3-dioxolane to afford a naphthoquinone diazide-based photosensitizer. The reaction is preferably carried out in the presence of a base and triethylamine, etc., are used as the base. The base is preferably used at 1.05–1.3 molar ratio to the 1,2-naphthoquinone diazide-4 or 1,2-naphthoquinone diazide-5-sulfonyl halide.

SUMMARY OF THE INVENTION

The present invention provides a photoresist composition comprising: a) at least one film forming resin selected from the group consisting of novolak resins, and polyhydroxystyrenes; b) at least one photoactive compound or photoacid generator; and c) a solvent composition comprising at least one solvent selected from the group consisting of acetals and ketals.

The present invention also provides a photoresist composition comprising a polycarbonate resin and a solvent composition comprising at least one solvent selected from the group consisting of acetals and ketals.

The present invention also provides a process for imaging a photoresist composition, comprising the steps of: a) coating a suitable substrate with any of the aforementioned photoresist compositions; b) baking the substrate to substantially remove the solvent; c) imagewise irradiating the photoresist film; and d) removing the imagewise exposed or, alternatively, the unexposed areas of the coated substrate with a suitable developer.

DETAILED DESCRIPTION OF THE INVENTION

The present invention provides a photoresist composition comprising: a) at least one film forming resin selected from the group consisting of novolak resins, and polyhydroxystyrenes; b) at least one photoactive compound or photoacid generator; and c) a solvent composition comprising at least one solvent selected from the group consisting of acetals and ketals.

Novolak resins of the present invention are those that have been commonly used in the art of photoresist manufacture as exemplified by "Chemistry and Application of Phenolic Resins", Knop A. and Scheib, W.; Springer Verlag, New York, 1979 in Chapter 4.

The novolak resins typically comprise the addition-condensation reaction product of at least one phenolic compound with at least one aldehyde source. The phenolic compounds include for example cresols (including all isomers), xylenols (such as 2,4- and 2,5-xylenols).

Aldehyde sources that can be used in this invention include formaldehyde, paraformaldehyde, trioxane, acetaldehyde, chloroacetaldehyde, and reactive equivalents of these aldehyde sources. Among these formaldehyde and paraformaldehyde are preferable. In addition mixtures of two or more different aldehydes can be used.

The acid catalyst used for the addition-condensation reaction includes hydrochloric acid, sulfuric acid, formic acid, acetic acid, oxalic acid, p-toluenesulfonic acid and the like.

The polyhydroxystyrene can be any polyhydroxystyrene, including single polymers of vinylphenol; copolymers of vinylphenol and an acrylate derivative, acrylonitrile, a methacrylate derivative, methacrylonitrile, styrene, or a styrene derivative such as alpha-methylstyrene, p-methylstyrene, o-hydrogenated resins derived from single polymers of vinylphenol; and hydrogenated resins derived from copolymers of vinylphenol and the above-described acrylate derivative, methacrylate derivative, or styrene derivative. Also, substituted polyhydroxystyrenes, in which the hydrogen atoms of some of the hydroxyl groups in the original polyhydroxystyrene have been replaced with alkali-solubility-suppressing groups, can be suitably used. Such alkali-solubility-suppressing groups may be, for example, tert-butyl groups, tert-butoxycarbonyl groups, tert-aminooxycarbonyl groups, ethoxyethyl groups, methoxypropyl groups, tetrahydropyranyl groups, tetrahydrofuranyl groups, benzyl groups, or trimethylsilyl groups.

The photoactive component (hereafter referred to as PAC) can be any compound known to be useful for use in photoresist compositons. Preferably it is diazonaphthoquinone sulfonate ester of a polyhydroxy compound. It can be prepared by esterification of 1,2-napthoquinonediazide-5-sulfonyl chloride and/or 1,2-naphthoquinonediazide-4-sulfonyl chloride with a polyhydroxy compound having 2–7 phenolic moieties and in the presence of basic catalyst.

Preferably, the number of the phenolic moieties per one molecule of the polyhydroxy compound used as a backbone of PAC is in the range of 2–7, and more preferably in the range of 3–5.

Some representative examples of polyhydroxy compounds are:

(a) Polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2'4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4',5'-hexahydroxybenzophenone;

(b) Polyhydroxyphenylalkylketones such as 2,3,4-trihydroxyacetophenone, 2,3,4-trihydroxyphenylpentylketone, and 2,3,4-trihydroxyphenylhexylketone;

(c) Bis(polyhydroxyphenyl)alkanes such as bis(2,3,4-trihydroxyphenyl)methane, bis(2,4-dihydroxyphenyl)methane, and bis(2,3,4-trihydroxyphenyl)propane;

(d) Polyhydroxybenzoates such as propyl 3,4,5-trihydroxy-benzoate, phenyl 2,3,4-trihydroxybenzoate, and phenyl 3,4,5-trihydroxybenzoate;

(e) Bis (polyhydroxybenzoyl)alkanes or bis (polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene, and bis(2,4,6-trihydroxybenzoyl)benzene;

(f) Alkylene di(polyhydroxybenzoates) such as ethyleneglycol-di(3,5-dihydroxybenzoate) and ethylene glycoldi(3,4,5-trihydroxybenzoate);

(g) Polyhydroxybiphenyls such as 2,3,4-biphenyltriol, 3,4,5-biphenyltriol, 3,5,3'5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol;

(h) Bis(polyhydroxy)sulfides such as 4,4'-thiobis(1,3-dihydroxy)benzene;

(i) Bis(polyhydroxyphenyl)ethers such as 2,2'4,4'-tetrahydroxydiphenyl ether;

(j) Bis(polyhydroxyphenyl)sulfoxides such as 2,2'4,4'-tetrahydroxydiphenylsulfoxide;

(k) Bis(polyhydroxyphenyl)sulfones such as 2,2',4,4'-tetrahydroxydiphenylsulfone;

(l) Polyhydroxytriphenylmethanes such as tris(4-hydroxyphenyl)methane), 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5-diacetyltriphenylmethane, and 2,4,6, 2',4',6'-hexahydroxy-5,5'-dipropionyltriphenylmethane;

(m) Polyhydroxy-spirobi-indanes such as 3,3,3',3'-tetramethyl-1,1'-spirobi-indane-5,6,5',6'-tetrol, 3,3,3'3'-tetramethyl-1,1'-spirobi-indane-5,6,7,6'6',7'-hexol, and 3,3,3'3'-tetramethyl-1,1'-spirobi-indane-4,5,6,4',5',6'-hexol;

(n) Polyhydroxyphthalides such as 3,3-bis(3,4-dihydroxyphenyl)phthalide, 3,3-bis(2,3,4-trihydroxyphenyl)phthalide, and 3',4',5',6'-tetrahydroxyspiro(phthalide-3,9'-xanthene);

(o) Polyhydroxy compounds described in JP No. 4-253058 such as alpha, alpha'alpha"-tris (4-hydroxyphenyl)-1,3,5-triisopropylbenzene, alpha, alpha', alpha"-tris(3,5-dimethyl-4-hydroxyphenyl)-1,3, 5-triisopropylbenzene, alpha, alpha', alpha"-tris (3,5-diethyl-4-hydroxyphenyl)-1,3,5-triisopropylbenzene, alpha, alpha', alpha"-tris (3,5-di-n-propyl-4-hydroxyphenyl)-1,3,5-tri-isopropylbenzene, alpha, alpha',alpha"-tris(3,5-diisopropyl-4-hydroxyphenyl)-1, 3,5-triisopropylbenz ene, alpha, alpha', alpha"-tris(3,5-di-n-butyl-4-hydroxyphenyl)-1,3,5-triisopropylbenzene, alpha, alpha', alpha"-tris(3-methyl-4-hydroxyphenyl)-1,3,5-triisopropyl-benzene, alpha, alpha', alpha"-tris(3-methoxy-4-hydroxyphenyl)-1,3,5-triisopropylbenzene, alpha, alpha', alpha"-tris(2,4-dihydroxyphenyl)-1,3,5-triisopropylbenzene, 2,4,6-tris(3,5-dimethyl-4-hydroxyphenylthiomethyl)mesitylene, 1-[alpha-methyl-alpha-(4"-hydroxyphenyl)ethyl]-4-[alpha, alpha'-bis(4"-hydroxyphenyl)ethyl]benzene, 1-[alpha-methyl-alpha-(4'-hydroxyphenyl)ethyl]-3-[alpha, alpha'-bis(4"-hydroxy-phenyl)ethyl]benzene, 1-[alpha-methyl-alpha-(3',5'-dimethyl-4'-hydroxyphenyl)ethyl] benzene, 1-[alpha-methyl-alpha-(3'-methoxy-4'-hydroxyphenyl)ethyl]-4-[alpha',alpha'-bis(3'-methoxy-4'-hydroxyphenyl)ethyl]benzene, and 1-[alpha-methyl-alpha-(2',4'-dihydroxyphenyl)ethyl]-4-[alpha',alpha'-bis(4'-hydroxyphenyl)ethyl]benzene.

Other examples of o-quinonediazide photoactive compounds include condensation products of novolak resins with an o-quinonediazide sulfonyl chloride. These condensation products (also called capped novolaks) may be used instead of o-quinonediazide esters of polyhydroxy compounds or used in combination therewith. Numerous U.S. Patents describe such capped novolaks. U.S. Pat. No. 5,225, 311 is one such example.

The photoacid generator (PAG) of the present invention can be any PAG known to one of ordinary skill in the art that is useful in photoresist compositions. PAG plays an important role in the imaging process for both positive-working and negative-working chemically amplified resists, because PAG governs light response properties, such as absorption of light or quantum yield of acid formation, and, in addition, governs the properties of the produced acid, such as acid strength, mobility, or volatility. Useful PAGs for both positive-working and negative-working chemically amplified resists include ionic onium salts, particularly iodonium salts or sulfonium salts with strong non-nucleophilic anions (U.S. Pat. No. 4,058,400 and U.S. Pat. No. 4,933,377), for example, hexafluoroantimonate and trifluoromethane sulfonate (U.S. Pat. No. 5,569,784) or aliphatic/aromatic sulfonates (U.S. Pat. No. 5,624,787). In addition, many non-ionic PAGs producing the above mentioned sulfonic acids have been described for both positive-working and negative-working chemically amplified photoresist materials (U.S. Pat. No. 5,286,867 and U.S. Pat. No. 5,338,641). Further, certain hydrogen halide producing PAGs have been suggested for advantageous use in negative-working chemically amplified resists (U.S. Pat. No. 5,599,949). PAGs are typically used in chemically amplified photoresist compositions. As such, the photoresist composition of the present invention can be a chemically amplified photoresist composition comprising a PAG.

The acetals and ketals of the present solvent composition include both acyclic and cyclic compounds. In one embodiment, the acyclic acetal or ketal is represented by the formula

$R^3$—O—$(CR^1R^2)$—O—$R^4$ wherein $R^1$ and $R^2$ are independently hydrogen or a hydrocarbyl group of 1 to about 10 carbon atoms, and in one embodiment 1 to 5 carbon atoms; and $R^3$ and $R^4$ are independently hydrocarbyl groups of 1 to about 10 carbon atoms, and in one embodiment, 1 to 5 carbon atoms. Two preferred examples of acyclic compounds useful in the present invention are dimethoxymethane and diethoxyethane.

As used herein, the term "hydrocarbyl substituent" or "hydrocarbyl group" is used in its ordinary sense, which is well-known to those skilled in the art. Specifically, it refers to a group having a carbon atom directly attached to the remainder of the molecule and having predominantly hydrocarbon character. Examples of hydrocarbyl groups include:

(1) hydrocarbon substituents, that is, aliphatic (e.g., alkyl or alkenyl), alicyclic (e.g., cycloalkyl, cycloalkenyl) substituents, and aromatic-, aliphatic-, and alicyclic-substituted aromatic substituents, as well as cyclic substituents wherein the ring is completed through another portion of the molecule (e.g., two substituents together form an alicyclic radical);

(2) substituted hydrocarbon substituents, that is, substituents containing non-hydrocarbon groups which, in the context of this invention, do not alter the predominantly hydrocarbon substituent (e.g., halo (especially chloro and fluoro), hydroxy, alkoxy, mercapto, alkylmercapto, nitro, nitroso, and sulfoxy);

(3) hetero substituents, that is, substituents which, while having a predominantly hydrocarbon character, in the context of this invention, contain other than carbon in a ring or chain otherwise composed of carbon atoms. Heteroatoms include sulfur, oxygen, nitrogen, and encompass substituents as pyridyl, furyl, thienyl and imidazolyl. In general, no more than two, preferably no more than one, non-hydrocarbon substituent will be present for every ten carbon atoms in the hydrocarbyl group; typically, there will be no non-hydrocarbon substituents in the hydrocarbyl group.

In one embodiment, the cyclic acetal or ketal is a 4–7 member ring compound. In one embodiment, the ring compound is represented by the formula

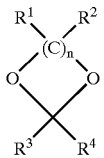

wherein $R^1$–$R^4$ are independently hydrogen, or hydrocarbyl groups of 1 to about 10 carbon atoms, and n is 1, 2, 3, or 4. In an especially preferred embodiment, the cyclic acetal or ketal is 1,3-dioxolane.

The solvent composition in addition to the presently claimed acetals and ketals can also comprise at least one suitable photoresist solvents. Useful photoresist solvents include, but are not limited to, ethyleneglycol monomethyl ether, ethyleneglycol monoethyl ether, propylene glycol monomethyl ether (PGME) ethyleneglycol monoethyl ether acetate, propyleneglycol alkyl ether acetate (such as propyleneglycol methyl ether acetate (PGMEA), propyleneglycol propyl ether acetate), methylbenzene, dimethylbenzene, methylethyl ketone, 2-heptanone, anisole, 3-methyl-3-methoxybutanol, cyclohexanone, ethyl-2-hydroxypropionate (ethyl lactate (EL)), ethyl-2-hydroxy-2-methyl propionate, ethyl hydroxyacetate, 2-hydroxy-3-methyl butanoate, methyl-3-methoxypropionate, ethyl-3- methoxy propionate, ethyl-3-ethoxypropionate, methyl-3-ethoxy propionate, methyl pyruvate, ethyl pyruvate, butyl acetate, and propyleneglycol monomethylether propionate. These organic solvents may be used either individually or in combination (i.e., as mixtures with others).

In one embodiment, the photoresist composition is capable of forming photoresists having a resist film thickness of 1 to 100 micrometers ($\mu$m), and in one embodiment, 10–90 $\mu$m, and in one embodiment 20–75 $\mu$m, and in one embodiment at least 30 $\mu$m, and in one embodiment, at least 50 $\mu$m. In other words, the present photoresist composition is useful for forming thick film photoresists.

The present invention also provides a photoresist composition comprising a polycarbonate resin and a solvent composition comprising at least one solvent selected from the group consisting of the aforementioned acetals and ketals.

The polycarbonate resin may be any polycarbonate resin, including a homopolymer or copolymer of a linear or branched thermoplastic aromatic polycarbonate prepared by reacting an aromatic dihydroxy compound or a mixture of the aromatic dihydroxy compound and a small amount of a polyhydroxy compound with phosgene or diester of carbonic acid, as disclosed in U.S. Pat. No. 6,359,028 B1.

As the aromatic dihydroxy compounds, bis(hydroxyaryl) alkanes such as 2,2-bis(4-hydroxyphenyl)propane(=bisphenol A), 2,2-bis(3,5-dibromo-4-hydroxyphenyl) propane(=tetrabromo-bisphenol A), bis(4-hydroxyphenyl) methane, 1,1-bis(4-hydroxyphenyl)ethane, 2,2-bis(4-hydroxyphenyl)butane, 2,2-bis(4-hydroxyphenyl)octane, 2,2-bis(4-hydroxy-3-methylphenyl)propane, 1,1-bis(3-t-butyl-4-hydroxyphenyl)propane, 2,2-bis(4-hydroxy-3,5-dimethylphenyl)propane, 2,2-bis(3-bromo-4-hydroxyphenyl)propane, 2,2-bis(3,5-dichloro-4-hydroxyphenyl)propane, 2,2-bis(3-phenyl-4-hydroxyphenyl)propane, 2,2-bis(3-cyclohexyl-4-hydroxyphenyl)propane, 1,1-bis(4-hydroxyphenyl)-1-phenyl ethane or bis(4-hydroxyphenyl)diphenylmethane; bis(hydroxyaryl)cycloalkanes such as 1,1-bis(4-hydroxyphenyl)cyclopentane or 1,1-bis(4-hydroxyphenyl) cyclohexane; dihydroxy-diaryl ethers such as 4,4'-dihydroxy-diphenyl ether or 4,4'-dihydroxy-3,3'-dimethyldiphenyl ether; dihydroxy-diaryl sulfides such as 4,4'-dihydroxy-diphenyl sulfide or 4,4'-dihydroxy-3,3'-dimethyldiphenyl sulfide; dihydroxy-diaryl sulfoxides such as 4,4'-dihydroxy-diphenyl sulfoxide or 4,4'-dihydroxy-3,3'-dimethyldiphenyl sulfoxide; dihydroxy-diaryl sulfones such as 4,4'-dihydroxy-diphenyl sulfone or 4,4'-dihydroxy-3,3'-dimethyidiphenyl sulfone; hydroquinone; resorcin; 4,4'-dihydroxy-diphenyl; or the like may be exemplified. These aromatic dihydroxy compounds may be used singly or in the form of the mixture thereof. Among them, 2,2-bis(4-hydroxyphenyl)propane is preferred.

In addition, branched polycarbonate resins can be obtained by using a polyhydroxy compound such as fluoroglucine, 2,6-dimethyl-2,4,6-tri(4-hydroxyphenyl)-3-heptene, 4,6-dimethyl-2,4,6-tri(4-hydroxyphenyl)-2-heptene, 1,3,5-tri(2-hydroxyphenyl)benzole, 1,1,1-tri(4-hydroxyphenyl)ethane, 2,6-bis(2-hydroxy-5-methylbenzyl)-4-methylphenol or a,a',a"-tri(4-hydroxyphenyl)-1,3,5-triisopropylbenzene; 3,3-bis(4-hydroxyaryl)-oxindole (=isatin-bisphenol); 5-chloroisatin-bisphenol; 5,7-dichloroisatin-bisphenol; 5-bromoisatin-bisphenol; or the like.

In a preferred embodiment, the polycarbonate resin is a homopolycarbonate based on Bisphenol A, available commercially as "Makrolon™ 2608" from Bayer Corporation.

In one embodiment, the weight average molecular weight ($M_w$) of the polycarbonate resin ranges from 2000 to 100,000, and in one embodiment, 10,000 to 60,000.

Optional ingredients for the photoresist compositions of the present invention include colorants, dyes, anti-striation agents, leveling agents, plasticizers, adhesion promoters, speed enhancers, solvents and such surfactants as non-ionic surfactants, which may be added to the solution of the film forming resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of the film forming resin and sensitizer. The dye additives help provide increased resolution by inhibiting back scattering of light off the substrate.

Anti-striation agents may be used at up to a five percent weight level, based on the combined weight of the film forming resin and sensitizer. Plasticizers which may be used include, for example, phosphoric acid tri-(beta-chloroethyl)-ester; stearic acid; dicamphor; polypropylene; acetal resins; phenoxy resins; and alkyl resins, at one to ten percent weight levels, based on the combined weight of the film forming resin and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyl trichlorosilane; and gamma-amino-propyl triethoxysilane, up to a 4 percent weight level, based on the combined weight of the film forming resin and sensitizer. Development speed enhancers that may be used include, for example, picric acid, nicotinic acid or nitrocinnamic acid up to a 20 percent weight level, based on the combined weight of the film forming resin and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and subsequent drying. Non-ionic surfactants that may be used include, for example, nonylphenoxy poly(ethyleneoxy) ethanol; octylphenoxy ethanol at up to 10% weight levels, based on the combined weight of the film forming resin and sensitizer.

The present invention also provides a process for imaging a photoresist composition, comprising the steps of: a) coating a suitable substrate with the aforementioned photoresist composition comprising the forming resin selected from the group consisting of novolak resins, and polyhydroxystyrenes; the photoactive compound or photoacid generator; and the solvent composition comprising at least one solvent selected from the group consisting of acetals and ketals; b) baking the substrate to substantially remove the solvent; c) imagewise irradiating the photoresist film; and d) removing the imagewise exposed or, alternatively, the unexposed areas of the coated substrate with a suitable developer.

The present invention also provides a process for imaging a photoresist composition, comprising the steps of: a) coating a suitable substrate with the aforementioned photoresist composition comprising the polycarbonate resin and the solvent composition comprising at least one solvent selected from the group consisting of acetals and ketals; b) baking the substrate to substantially remove the solvent; c) imagewise irradiating the photoresist film; and d) removing the image-wise exposed or, alternatively, the unexposed areas of the coated substrate with a suitable developer.

The photoresist composition can be applied to the substrate by any conventional method used in the photoresist art, including dipping, spraying, whirling and spin coating. When spin coating, for example, the resist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist composition may also be coated over an antireflective coating.

The photoresist compositions produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane, preferably hexamethyl disilazane (HMDS).

The photoresist composition is coated onto the substrate, and the coated substrate is heat treated until substantially all of the solvent is removed. In one embodiment, heat treatment of the coated substrate involves heating the coated substrate at a temperature from 70° C. to 150° C. for from 30 seconds to 180 seconds on a hot plate or for from 15 to 90 minutes in a convection oven. This temperature treatment is selected in order to reduce the concentration of residual solvents in the photoresist composition, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from 95° C. to 120° C. The treatment is conducted until the rate of change of solvent removal becomes relatively insignificant. The temperature and time selection depends on the photoresist properties desired by the user, as well as the equipment used and commercially desired coating times.

The coated substrate can then be exposed to actinic radiation, e.g., radiation at a wavelength of from 100 nm to 450 nm including i-line (365 nm), g-line (436 nm) deep UV (248 nm) ArF (193 nm) and $F_2$ (157 nm) radiations, x-ray, electron beam, ion beam or laser radiation, in any desired pattern, produced by use of suitable masks, negatives, stencils, templates, etc.

The substrate coated with the photoresist composition is then optionally subjected to a post exposure second baking or heat treatment, either before or after development. The heating temperatures may range from 90° C. to 150° C., more preferably from 100° C. to 130° C. The heating may be conducted for from 30 seconds to 2 minutes, more preferably from 60 seconds to 90 seconds on a hot plate or 30 to 45 minutes by convection oven.

The exposed photoresist-coated substrates are developed to remove the image-wise exposed areas (positive photoresists), or the unexposed areas (negative photoresists), by immersion in an alkaline developing solution or developed by a spray development process. The solution is preferably agitated, for example, by nitrogen burst agitation. The substrates are allowed to remain in the developer until all, or substantially all, of the photoresist coating has dissolved from the exposed or unexposed areas. Developers can include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

EXAMPLES

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight, all temperatures are in degrees Centigrade, and all molecular weights are weight average molecular weight.

Example 1

Two samples of a thick resist were prepared as depicted below in Table 1. In Sample A, the resist was made using a typical resist solvent while in Sample B, a portion of the solvent was replaced with 1,3-dioxolane (a cyclic acetal which can be made by condensation of formaldehyde with 1,2-ethylene diol).

TABLE 1

| Ingredients | Sample A | Sample B |
|---|---|---|
| Novolak Resin* | 42.17 g | 42.17 g |
| Photoactive Compound** | 5.42 g | 05.42 g |
| PGMEA | 52.41 g | 36.17 g |
| 1,3-dioxolane | — | 14.24 g |
| Total | 100 g | 100 g |

TABLE 1-continued

| Ingredients | Sample A | Sample B |
|---|---|---|

*condensation product of formaldehyde with 47.8% p-cresol, 42% m-cresol, 5.6% 2,4-xylenol and 4.6% 2,5-xylenol under acid conditions (available from AZ Electronic Materials, Clariant Corporation as "Alnovol SPN 400")
**95% tris sulfonate ester of 2,3,4-trihydroxy benzophenone with 2,1,5 quinone diazide sulfonyl chloride (available from Clariant Corporation as "PW 2484")
PGMEA = propylene glycol methyl ether acetate Silicon wafers were coated to the same nominal coating thickness of 65 µm and were exposed at 365 nm through a positive photomask. The wafers were then developed with a tetramethyl ammonium hydroxide developer and the images were analyzed. Sample A required 4000 mJ/cm2 for optimum resolution while Sample B could be exposed in only 1500 mJ/cm2 showing almost a 2.5 fold increase in photospeed. Both resists could resolve 50 µm contact holes under the same conditions.

Example 2

A negative acting photoresist was prepared comparing the control Sample A of Table 1 above using the standard solvent against the test Sample B containing a portion of the solvent replaced by 1,3-dioxolane, as shown in Table 2 below.

TABLE 2

| Ingredients | Sample A | Sample B |
|---|---|---|
| Novolak Resin (same as Example 1) | 39.7 g | 39.7 g |
| DML-POP* | 1.3 g | 1.3 g |
| Cymel 303** | 6.2 g | 6.2 g |
| DR-249*** | 0.8 g | 0.8 g |
| PGMEA | 50.8 g | 35.8 g |
| 1,3-dioxolane | — | 15.0 g |
| Megafac R-08 (10%)**** | 1.2 g | 1.2 g |
| Total | 100 g | 100 g |

*2,6 dimethylol-4-(1,1,3,3-tetramethyl butyl) phenol (cross linker; from Honshu Chem. Ind.)
**hexamethoxy methyl melamine (cross linker; from Cytec Industries)
***Oxime sulfonate salt (photoacid generator; available from Clariant GmbH)
****Flourinated surface active agent (available from Dainippon Ink Corp.)

Wafers were coated at 30 µm dry coating weight onto silicon wafers. The wafers were exposed through a negative mask using a broad band exposure unit. Sample B showed about a 15% faster photospeed when compared to Sample A. The side wall profile of the imaged lines for Sample B was straighter and closer to vertical when compared to the lines evident with Sample A.

Example 3

Positive resist samples were prepared with mixed solvent systems. In Sample A, the control sample was prepared with a mixture of standard resist solvents while Sample B contained 1,3-dioxolane as a portion of the solvent system, as shown in Table 3 below.

TABLE 3

| Ingredients | Sample A | Sample B |
|---|---|---|
| Novolak Resin (Same as Example 1) | 21.0 g | 21.0 g |
| 10% sol. of 4,4'dihydroxy benzophenone* | 9.5 g | 9.5 g |
| Photoactive compound (same as Example 1) | 4.2 g | 4.2 g |
| PGMEA | 20.3 g | 20.3 g |
| Ethyl lactate | 24.0 g | — |
| 1,3-dioxolane | — | 24.0 g |

*Sensitizing dye

Samples were spin coated onto hexamethyl disilazane treated Silicon wafers at about 1 µm thickness and were exposed through a positive photomask at 365 nm. Optimum exposure for Sample B was 5% faster than that for Sample A. In addition, Sample B images had an improved depth of focus of about 0.3 µm.

Example 4

Polycarbonate resins have limited solubility in many typical organic solvents. In a coating application for these resins the only other viable solvent was n-methyl pyrolidinone (NMP). Solutions (containing 0.7% solids) of a commercial polycarbonate resin (Makrolon™ 2608, available from Bayer Corporation) were made in NMP and 1,3-dioxolane respectively. Sealed vials of the solutions were stored at 50° C. and were sampled for viscosity vs. time. Whereas the solution made with NMP changed in viscosity from about 60 cst ($mm^2$/sec) to <40 cst in about a week, the sample prepared in 1,3-dioxolane remained unchanged.

Example 5

Polycarbonate composition (solutions of Makrolon™ 2608 in 1,3-dioxolane or NMP) from Example 4 above was coated onto glass substrates and were imaged with high energy ionic radiation (e.g., as disclosed in the following references: 1) "Etched heavy ion tracks in polycarbonate as template for copper nanowires", Toimil Molares, M. E.; Brotz, J.; Buschmann, V.; Dobrev, D.; Neumann, R.; Scholz, R.; Schuchert, I. U.; Trautmann, C.; Vetter, J. Gellschaft fur Schwerionenforschung-GSI, Darmstadt, Germany. Nuclear Instruments & Methods in physics Research, Section B: Beam Interactions with Materials and Atoms (2001), 185, 192–197; 2) "Scanning force microscopy of heavy-ion tracks", Ackermann, J.; Grafstroem, S.; Neitzert, M.; Neumann, R.; Trautmann, C.; Vetter, J.; Angert, N. Ges. Schwerioneneforsch., Darmstadt, Germany. Radiat. Eff. Defects Solids (1993), 126(1–4), 213–16; 3) "Heavy-ion tracks in polycarbonate", Ferain, E.; Legras, R. Unite Chim. Phys. Hauts Polym., UCL, Louvain-la-Neuve, Belg. Radiat. Eff. Defects Solids (1993), 126(1–4), 243–6) through a screen. Imaged areas contained products of polymer chain scission and could be developed while non-image areas remained intact. The compositions in 1,3-dioxolane could be coated to the desired thickness even when stored under ambient conditions for more than six months while the coating thickness possible under the same coating conditions with the compositions in NMP continued to get thinner due to premature scission of the polymer in solution. After less than one week the NMP solutions of the composition could not be used. Imaging performance of the NMP solutions deteriorated at the same time since contrast between image and non-image areas deteriorated as well.

Example 6

Two positive acting resists were prepared. A control Sample A contained the standard solvents whereas Sample B contained a portion of a cyclic acetal solvent, shown in Table 4 below.

TABLE 4

| Ingredients | Sample A | Sample B |
|---|---|---|
| Novolak Resin | 41.9% | 41.9% |
| Speed Enhancing Resin** | 2.9% | 2.9% |
| Diazonaphthoquinone sensitizer*** | 4.2% | 4.2% |
| PGME | 40.9% | 35.7% |
| PGMEA | 10.1% | 8.9% |
| Diethoxymethane | — | 6.4% |

*Phenol-formaldehyde resin (available as "MER-7930" from Meiwa Corp. (Japan))
**Low Mw Phenol-formaldehyde resin (available as "Shonol CRG-951" from Showa Kobunshi Co., Ltd. (Japan))
***Oligomeric phenol-formaldehyde resin partially esterified with 2,1,5-diazopnaphthoquinone sulfonyl chloride (available from Clariant as "PW 798" and from Nippon Zeon Corp. (Japan) as "NK-280")

Both resists could be readily coated to 65 μm. When imaged through a positive mask, both could be readily developed in dilute tetramethyl ammonium hydroxide developer (0.26N; available as AZ™ MIF 300, from AZ Electronic Materials, Clariant Corporation)

Each of the documents referred to above is incorporated herein by reference in its entirety, for all purposes. Except in the Examples, or where otherwise explicitly indicated, all numerical quantities in this description specifying amounts and concentrations of materials, reaction and process conditions (such as temperature, time), and the like are to be understood to be modified by the word "about".

It must be noted that as used in this specification and the appended claims, the singular forms "a," "an," and "the" include plural reference unless the context clearly dictates otherwise. Unless defined otherwise all technical and scientific terms used herein have the same meaning as commonly understood to one of ordinary skill in the art to which this invention belongs.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A photoresist composition comprising: a) at least one film forming resin selected from the group consisting of novolak resins and polyhydroxystyrenes; b) at least one photoactive compound or photoacid generator; and c) a solvent composition comprising at least one photoresist solvent and at least one solvent selected from the group consisting of acetals and ketals, wherein the amount of the solvent selected from the group consisting of acetels and ketals ranges from between about 6% to about 15% based on the total weight of the photoresist composition.

2. The photoresist composition of claim 1, wherein the acetal or ketal is an acyclic compound.

3. The photoresist composition of claim 1, wherein the acetal or ketal is a cyclic compound.

4. The photoresist composition of claim 2, wherein the acetal or ketal is represented by the formula $$R^3\text{—O—}(CR^1R^2)\text{—O—}R^4$$

wherein $R^1$ and $R^2$ are independently hydrogen or a hydrocarbyl group of 1 to about 10 carbon atoms; and $R^3$ and $R^4$ are independently hydrocarbyl groups of 1 to about 10 carbon atoms.

5. The composition of claim 4, wherein the hydrocarbyl groups are alkyl groups.

6. The photoresist composition of claim 3, wherein the cyclic compound is a 4–7 member ring compound.

7. The photoresist composition of claim 6, wherein the ring compound is represented by the formula

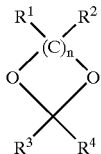

wherein $R^1$-$R^4$ are independently hydrogen, or hydrocarbyl groups of 1 to about 10 carbon atoms, and n is 1, 2, 3, or 4.

8. The photoresist composition of claim 1, wherein the solvent selected from the group consisting of acetals and ketals is 1,3-dioxolane.

9. The photoresist composition of claim 1, wherein the solvent composition is a mixture of at least one photoresist solvent selected from the group consisting of propylene glycol methyl ether acetate (PGMEA), ethyl lactate and propylene glycol methyl ether (PGME) and the solvent selected from the group consisting of acetals and ketals is is 1,3-dioxolane.

10. The photoresist composition of claim 1, wherein the solvent selected from the group consisting of acetals and ketals comprises at least one compound selected from the group consisting of dimethoxymethane and diethoxymethane.

11. The photoresist composition of claim 1, wherein the photoactive compound is a diazonaphthoquinone sulfonate ester.

12. The photoresist composition of claim 1 wherein the film forming resin is a novolak resin.

13. The photoresist composition of claim 1 that is a chemically amplified photoresist composition comprising a photoacid generator.

14. The photoresist composition of claim 1, capable of forming photoresists having a resist film thickness of 1 to about 100 μm.

15. The photoresist composition of claim 14, wherein the photoresist has a film thickness of at least 30 μm.

16. The photoresist composition of claim 14, wherein the photoresist has a film thickness of at least 50 μm.

17. A process for imaging a photoresist composition, comprising the steps of:
   a) coating a substrate with a film of photoresist composition of claim 1;
   b) baking the substrate to substantially remove the solvent;
   c) imagewise irradiating the photoresist film; and
   d) removing the imagewise exposed or, alternatively, the unexposed areas of the coated substrate with a suitable developer.

18. The process of claim 17, wherein the film of photoresist composition has a film thickness of at least 30 μm after step (b).

19. The process of claim 17, wherein the film of photoresist composition has a film thickness of at least 50 μm after step (b).

20. The process of claim 17, wherein the substrate is a semiconductor wafer.

21. A photoresist composition comprising a polycarbonate resin and a solvent composition comprising at least one solvent selected from the group consisting of acetals and ketals.

22. The photoresist composition of claim 21, wherein the polycarbonate resin is a homopolycarbonate based on Bisphenol A.

23. The photoresist composition of claim 21, wherein the polycarbonate resin has a weight average molecular weight ($M_w$) of about 2000 to about 100,000.

24. The photoresist composition of claim 21, wherein the polycarbonate resin has a weight average molecular weight ($M_w$) is about 10,000 to about 60,000.

25. A process for imaging a photoresist composition, comprising the steps of:
   a) coating a substrate with a film of photoresist composition of claim 21;
   b) baking the substrate to substantially remove the solvent;
   c) imagewise irradiating the photoresist film; and
   d) removing the imagewise exposed or, alternatively, the unexposed areas of the coated substrate with a suitable developer.

26. The photoresist composition of claim 1 wherein the film forming resin is a polyhydroxystyrene.

* * * * *

UNITED STATES PATENT AND TRADEMARK OFFICE
CERTIFICATE OF CORRECTION

PATENT NO. : 6,911,293 B2
DATED : June 28, 2005
INVENTOR(S) : Stanley F. Wanat et al.

It is certified that error appears in the above-identified patent and that said Letters Patent is hereby corrected as shown below:

Title page,
Item [75], should read:
-- [75] Inventors: Stanley F. Wanat, Scotch Plains, NJ (US); Joseph E. Oberlander, Phillipsburg, NJ (US); Robert R. Plass, Hackensack, NJ (US); Douglas McKenzie, Easton, PA (US); Hong Zhuang, Raritan, NJ (US) --.

Signed and Sealed this

Thirtieth Day of August, 2005

JON W. DUDAS
*Director of the United States Patent and Trademark Office*